United States Patent
Iwamoto (10) Patent No.: US 10,304,645 B2
(45) Date of Patent: May 28, 2019

(54) TRIMMING APPARATUS

(71) Applicant: FUJI ELECTRIC CO., LTD., Kawasaki-shi, Kanagawa (JP)

(72) Inventor: Motomitsu Iwamoto, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 49 days.

(21) Appl. No.: 15/373,039

(22) Filed: Dec. 8, 2016

(65) Prior Publication Data

US 2017/0169975 A1 Jun. 15, 2017

(30) Foreign Application Priority Data

Dec. 9, 2015 (JP) .................. 2015-240358
Oct. 13, 2016 (JP) .................. 2016-201404

(51) Int. Cl.
*H01H 37/76* (2006.01)
*H03K 19/21* (2006.01)
*G11C 19/28* (2006.01)

(52) U.S. Cl.
CPC ............ *H01H 37/76* (2013.01); *G11C 19/28* (2013.01); *H03K 19/21* (2013.01)

(58) Field of Classification Search
CPC .................... H01H 85/0241; H01H 37/76
See application file for complete search history.

(56) References Cited

U.S. PATENT DOCUMENTS

| 5,412,594 | A * | 5/1995 | Moyal ............... | G11C 17/16 365/196 |
| 6,781,436 | B2 * | 8/2004 | Kothandaraman .... | G11C 17/16 327/525 |
| 7,463,503 | B2 * | 12/2008 | Morii ................ | G11C 17/165 365/225.7 |
| 2002/0003483 | A1 * | 1/2002 | Hashimoto ......... | H03M 1/1057 341/121 |
| 2006/0158920 | A1 * | 7/2006 | Sumi ................. | G11C 17/18 365/96 |
| 2006/0268485 | A1 * | 11/2006 | Yanagida ........... | G11C 17/18 361/104 |

(Continued)

FOREIGN PATENT DOCUMENTS

JP   H05-63090 A   3/1993
JP   2010-267922 A   11/2010

*Primary Examiner* — Thomas J. Hiltunen
(74) *Attorney, Agent, or Firm* — Rabin & Berdo, P.C.

(57) ABSTRACT

A trimming apparatus for adjusting an electric property of a trimming object circuit. The trimming apparatus includes a data input pad that receives an input of serial data, a shift register that outputs parallel setting data by shifting the received serial data, a trimming data generating circuit, and a cutting control circuit that controls application of an electric signal to the trimming data generating circuit. The trimming data generating circuit includes a plurality of trimming elements, each having a conductive part cuttable by a flow of the electric signal, a plurality of pull-up resistors respectively connected to high potential sides of the trimming elements, and a plurality of switches respectively connected to low potential sides of the trimming elements. The trimming data generating circuit is configured to generate trimming data for the trimming object circuit by switching the plurality of switches in accordance with a level of the setting data.

6 Claims, 10 Drawing Sheets

(56) References Cited

U.S. PATENT DOCUMENTS

| | | | | |
|---|---|---|---|---|
| 2008/0036527 A1* | 2/2008 | Nishihara | ............... | G11C 17/16 327/525 |
| 2008/0186789 A1* | 8/2008 | Sumi | ...................... | G11C 17/18 365/225.7 |
| 2010/0244933 A1* | 9/2010 | Matsuo | .................. | G11C 17/18 327/525 |
| 2013/0135034 A1* | 5/2013 | Jeong | ..................... | G11C 17/16 327/525 |

* cited by examiner

| BIT WIDTH OF TRIMMING OBJECT CIRCUIT | 4bit | | 5bit | | 6bit | | 7bit | | 8bit | |
|---|---|---|---|---|---|---|---|---|---|---|
| | ESTIMATION OF RESULT BEFORE FUSE CUTTING | NUMBER OF NECESSARY PADS | ESTIMATION OF RESULT BEFORE FUSE CUTTING | NUMBER OF NECESSARY PADS | ESTIMATION OF RESULT BEFORE FUSE CUTTING | NUMBER OF NECESSARY PADS | ESTIMATION OF RESULT BEFORE FUSE CUTTING | NUMBER OF NECESSARY PADS | ESTIMATION OF RESULT BEFORE FUSE CUTTING | NUMBER OF NECESSARY PADS |
| TRIMMING CIRCUIT 20 | IMPOSSIBLE | 4 | IMPOSSIBLE | 5 | IMPOSSIBLE | 6 | IMPOSSIBLE | 7 | IMPOSSIBLE | 8 |
| TRIMMING CIRCUIT 30 | POSSIBLE | 6 | POSSIBLE | 7 | POSSIBLE | 8 | POSSIBLE | 9 | POSSIBLE | 10 |
| TRIMMING APPARATUS 10, 10-2 | POSSIBLE | 5 | POSSIBLE | 5 | POSSIBLE | 5 | POSSIBLE | 5 | POSSIBLE | 5 |

T1

| COMPARED AGAINST | EFFECT | REASON |
|---|---|---|
| TRIMMING CIRCUIT 20 | MANUFACTURING YIELD RATE IMPROVES MORE IN TRIMMING APPARATUSES 10 and 10-2 | BECAUSE AFTER-FUSE-CUTTING STATE MAY BE ESTIMATED |
| | WHEN BIT WIDTH OF TRIMMING OBJECT CIRCUIT IS 6 BITS OR MORE, CHIP COST TURNS OUT TO BE LOWER IN TRIMMING APPARATUSES 10 AND 10-2 | BECAUSE, WITH 6 BITS OR MORE, TRIMMING APPARATUSES 10 AND 10-2 MAY NEED FEWER PADS AND SMALLER CHIP AREA |
| TRIMMING CIRCUIT 30 | REGARDLESS OF BIT WIDTH OF TRIMMING OBJECT CIRCUIT, CHIP COST TURNS OUT TO BE LOWER IN TRIMMING APPARATUSES 10 AND 10-2 | BECAUSE, REGARDLESS OF TRIMMING BIT WIDTH, TRIMMING APPARATUSES 10 AND 10-2 MAY NEED FEWER PADS AND SMALLER CHIP AREA |
| | | BECAUSE TRIMMING APPARATUS 10-2 MAY CONFIRM ALL TRIMMING DATA PATTERN RESULTS WITH SMALLER NUMBER OF CLOCKS AND MAY THUS TAKE SHORTER TEST TIME |

FIG. 10

TRIMMING APPARATUS

CROSS-REFERENCE TO RELATED APPLICATIONS

This application is based upon and claims the benefit of priority of the prior Japanese Patent Application No. 2015-240358, filed on Dec. 9, 2015, and Japanese Patent Application No. 2016-201404, filed on Oct. 13, 2016, the entire contents of which are incorporated herein by reference.

BACKGROUND OF THE INVENTION

1. Field of the Invention

The embodiments discussed herein relate to a trimming apparatus.

2. Background of the Related Art

In general, manufacturing variations result that electric properties of circuit components, such as ICs (Integrated Circuits), deviate from their standard values. The deviation beyond a tolerable value would cause an error and affect circuit operation. Consequently, in manufacturing semiconductor devices, trimming is performed to correct deviations from the standard values of electric properties.

In a trimming circuit, usually a bit value is set in a trimming object by cutting a prescribed fuse with a signal inputted from a pad. In this application, "cutting" a fuse refers to causing the fuse to blow.

Conventionally, there has been proposed a technique of creating, prior to cutting a fuse within ICs, a state simulating the fuse being cut so as to allow estimation of the result of fuse cutting.

Japanese Laid-open Patent Publication No. 05-63090
Japanese Laid-open Patent Publication No. 2010-267922

Some conventional trimming circuits do not allow estimation of an after-fuse-cutting state before the fuse is actually cut. Some electric properties may not necessarily fall within their standards after fuse cutting, and therefore failing to estimate the after-fuse-cutting state before cutting the fuse may result in a problem of reduced manufacturing yield rate (percentage of non-defective products among those released from the production line).

Meanwhile, in a trimming circuit of the above literatures, an after-fuse-cutting state may be preliminarily estimated by processing input data coming from a pad through a shift register and a selector. In the configuration of the trimming circuit in the above literatures, however, there exists a problem that an increase of bit width to be set in a circuit to be trimmed causes the number of pads, i.e., external input terminals to increase, accompanied with an increase of chip area as well.

SUMMARY OF THE INVENTION

According to an aspect, there is provided a trimming apparatus for adjusting an electric property value of a trimming object circuit. The trimming apparatus includes: a single data input pad that receives input of serial data to allow input of an n-bit value to the trimming object circuit; a shift register that outputs parallel setting data by shifting the serial data received through the data input pad by n bits; a trimming data generating circuit that includes trimming elements having conductive parts which are cuttable by a flow of an electric signal, pull-up resistors respectively connected to high potential sides of the trimming elements, and switches respectively connected to low potential sides of the trimming elements, and that generates trimming data to be inputted to the trimming object circuit from nodes by switching the switches in accordance with a level of the setting data, the nodes respectively connecting the pull-up resistors and the trimming elements; and a cutting control circuit that controls application of the electric signal to the trimming data generating circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings, wherein like reference numerals refer to like elements throughout.

First Embodiment

Figure 1:
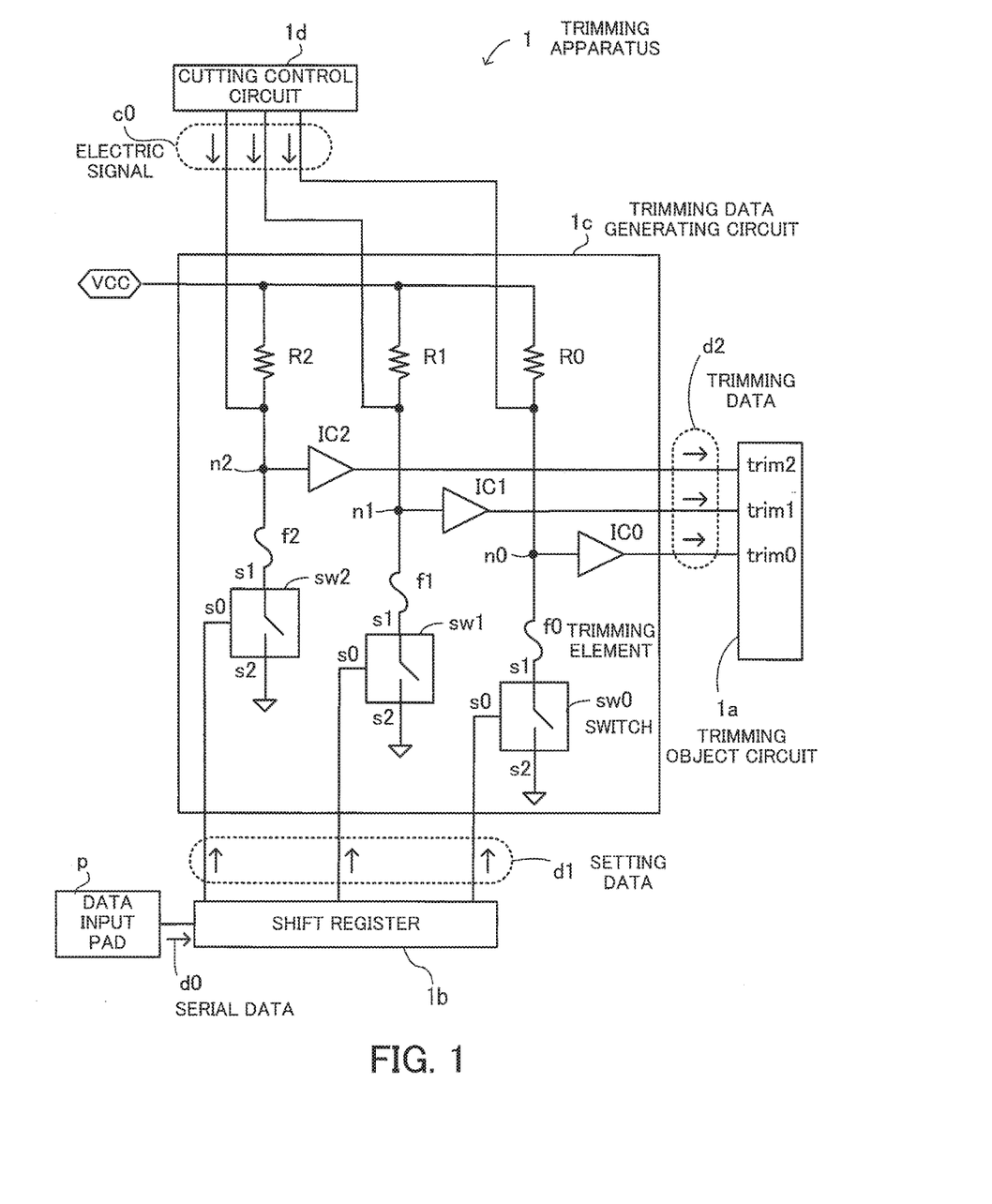
FIG. 1 illustrates an exemplary configuration of a trimming apparatus.

FIG. 1 illustrates an exemplary hardware configuration of a trimming apparatus. A trimming apparatus 1 according to a first embodiment includes a data input pad p, a trimming object circuit 1a, a shift register 1b, a trimming data generating circuit 1c, and a cutting control circuit 1d.

The trimming object circuit 1a corresponds to a device or the like which may be trimmed to have a bit value set therein. FIG. 1 illustrates a case of a 3-bit (trim0 to trim2) circuit.

The data input pad p is a single pad which receives input of serial data d0 to allow input of an n (=1, 2, 3, . . . ) bit value to the trimming object circuit 1a. The shift register 1b shifts the serial data d0 received through the data input pad p by n bits and outputs parallel setting data d1.

The trimming data generating circuit 1c includes trimming elements f0 to f2, pull-up resistors R0 to R2, switches sw0 to sw2, and buffers IC0 to IC2.

Each of the trimming elements f0 to f2 is an element having a conductive part which is cuttable by a flow of an electric signal c0 having at least a rated electric current or voltage, and an example of using fuses is illustrated in FIG.

1 (a trimming element is hereunder referred to as a fuse). Note that Zener-zap trimming may be applied by using Zener diodes, besides fuses. In this application, "cutting" a conductive part of a trimming element refers to causing the conductive part to fuse or blow.

The connection relationship between components in the interior of the trimming data generating circuit 1c is as follows. One ends of the pull-up resistors R0 to R2 are connected to a power source VCC. The other ends of the pull-up resistors R0 to R2 are connected to output terminals of the cutting control circuit 1d, input terminals of the buffers IC0 to IC2, and one ends of the fuses f0 to f2, respectively. Output terminals of the buffers IC0 to IC2 are connected to the terminals trim0 to trim2 in the trimming object circuit 1a, respectively.

Terminals s0 of the switches sw0 to sw2 are switch control terminals connected to output terminals of the shift register 1b, respectively. Terminals s1 of the switches sw0 to sw2 are connected to the other ends of the fuses f0 to f2, respectively, and terminals s2 of the switches sw0 to sw2 are connected to GND.

In the configuration, the trimming data generating circuit 1c generates trimming data d2 that is supplied to the trimming object circuit 1a from nodes n0 to n2 where the pull-up resistors R0 to R2 are connected to the trimming elements f0 to f2, respectively, by switching the switches sw0 to sw2 in accordance with the levels of the setting data d1. The trimming data d2 is generated by buffering the voltages of the nodes n0 to n2 by the buffers IC0 to IC2, and transmitted to the trimming object circuit 1a, respectively.

The cutting control circuit 1d controls the application of an electric signal c0 to the trimming data generating circuit 1c. Here, when applying the electric signal c0 to the trimming data generating circuit 1c, the electric signal c0 of n bits is applied collectively.

In the trimming apparatus 1 configured as above, an after-fuse-cutting state may be estimated before the fuse is actually cut and hence the manufacturing yield rate may be improved. Further, it becomes possible to suppress an increase of the number of pads, i.e., external input terminals and hence reduce the chip area, even when the bit width of the trimming object circuit 1a increases.

Problems to be Solved

Figure 2:
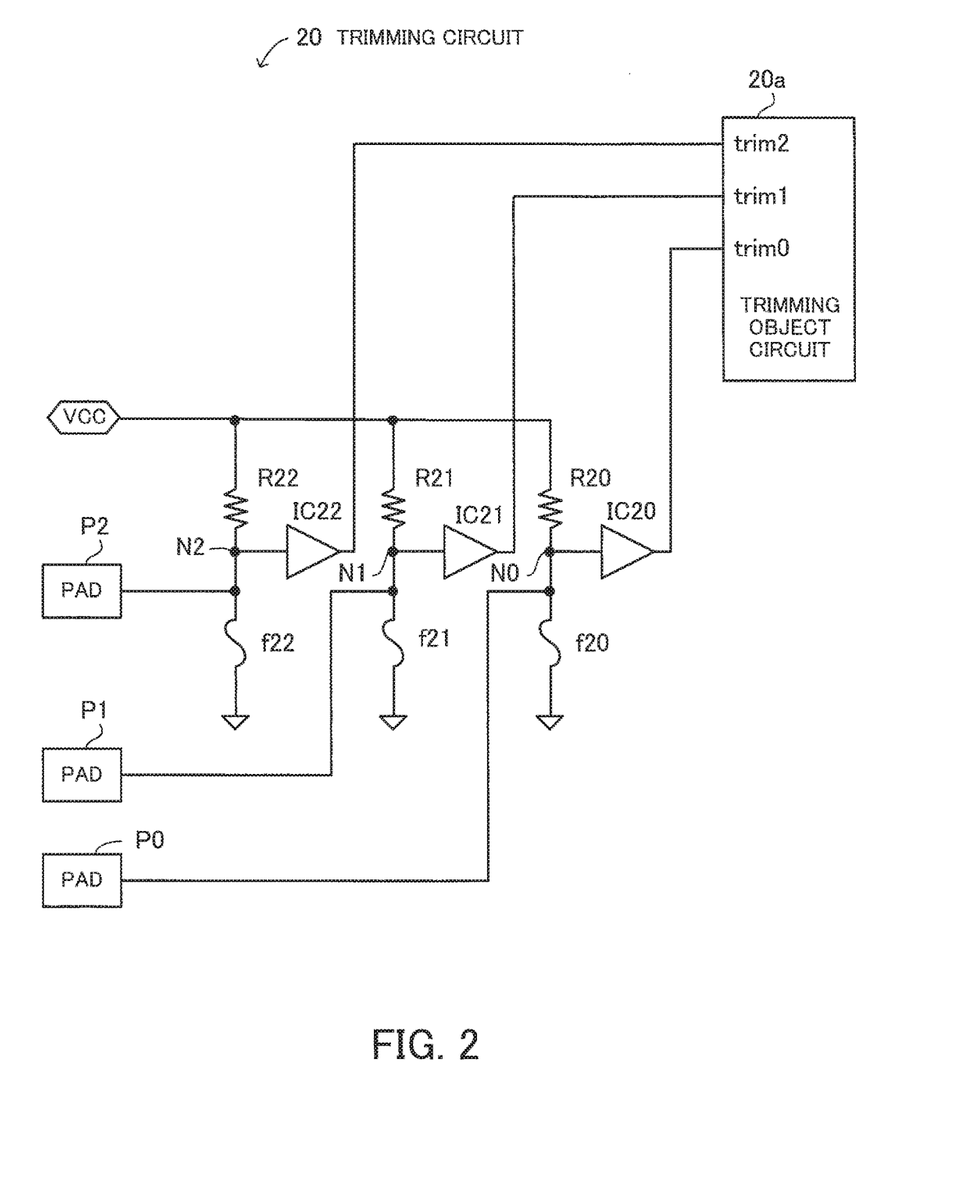
FIG. 2 illustrates an exemplary configuration of a trimming circuit.
Figure 3:
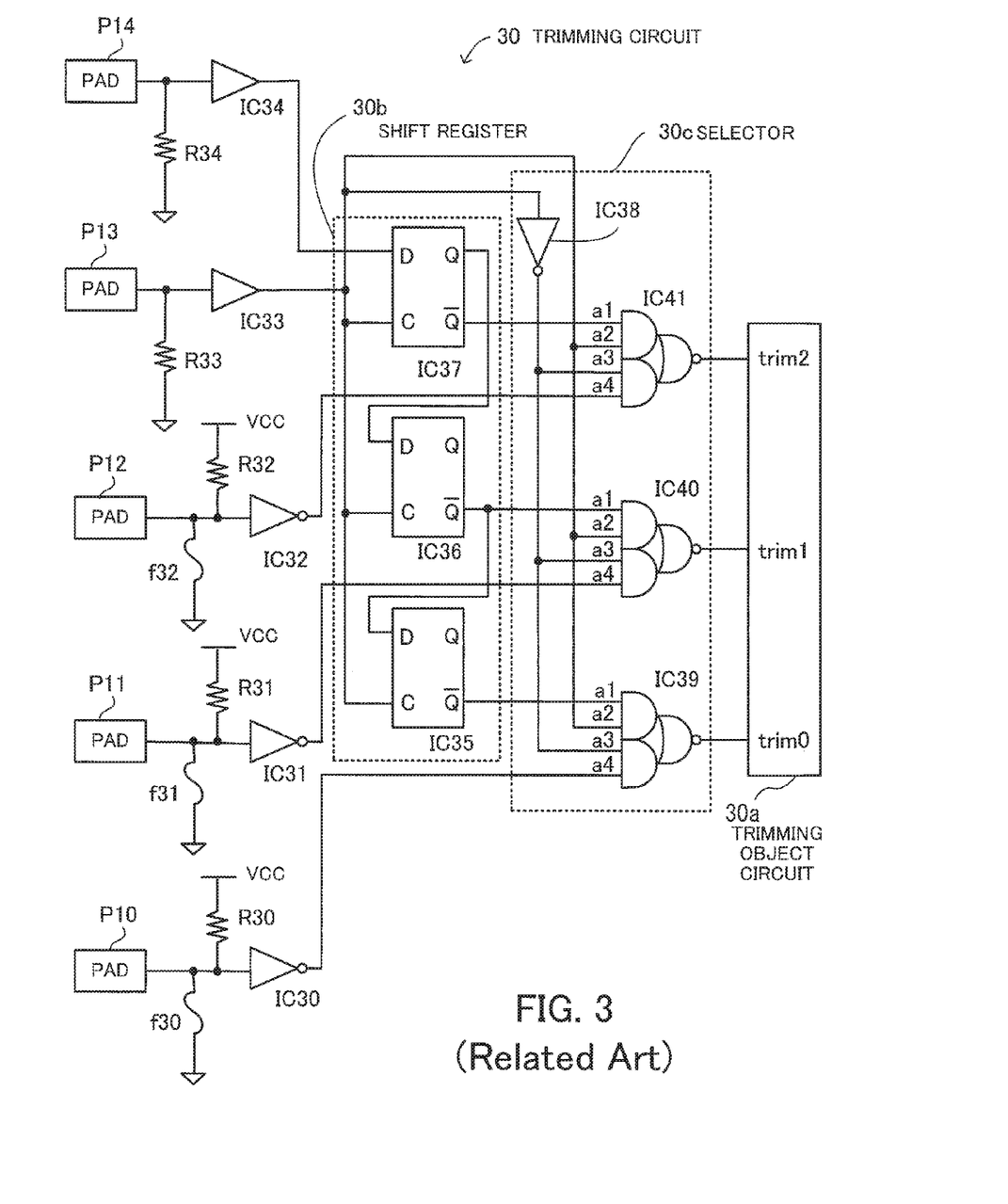
FIG. 3 illustrates an exemplary configuration of a trimming circuit.

Problems to be solved are hereunder explained in reference to FIGS. 2 and 3 before the details of the technique are explained. FIG. 2 illustrates an exemplary configuration of a trimming circuit. The configuration of a conventional trimming circuit incapable of estimating an after-fuse-cutting state before the fuse cutting is illustrated.

A trimming circuit 20 includes a trimming object circuit 20a, resistors R20 to R22, fuses f20 to f22, buffers IC20 to IC22, and pads P0 to P2.

The connection relationship between the constituent elements is as follows. A power source VCC is connected to one ends of the resistors R20 to R22. The pad P0 is connected to the other end of the resistor R20, an input terminal of the buffer IC20, and one end of the fuse f20, and the other end of the fuse f20 is connected to GND. An output terminal of the buffer IC20 is connected to a terminal trim0 of the trimming object circuit 20a.

The pad P1 is connected to the other end of the resistor R21, an input terminal of the buffer IC21, and one end of the fuse f21, and the other end of the fuse f21 is connected to GND. An output terminal of the buffer IC21 is connected to a terminal trim1 of the trimming object circuit 20a.

The pad P2 is connected to the other end of the resistor R22, an input terminal of the buffer IC22, and one end of the fuse f22, and the other end of the fuse f22 is connected to GND. An output terminal of the buffer IC22 is connected to a terminal trim2 of the trimming object circuit 20a.

Here, the relationship between the resistance values of the resistors R20 to R22 and the resistance values of the fuses f20 to f22 satisfies inequality expressions $R20>>f20$, $R21>>f21$, and $R22>>f22$.

Here, it is assumed that an electric property of the trimming object circuit 20a deviates from a standard and the respective bit values of the trimming object circuit 20a need to be corrected to {trim2, trim1, trim0}={0, 0, 1}.

In an initial state, because the inequality expressions $R20>>f20$, $R21>>f21$, and $R22>>f22$ hold, nodes N0 to N2 conduct to the GND side and the outputs of the buffers IC20 to IC22 take an L level. Therefore, the respective bit values of the trimming object circuit 20a are given as {trim2, trim1, trim0}={0, 0, 0}.

Accordingly, when trimming is applied, a voltage is applied to the pad P0 to cut the fuse f20. As a result, the node N0 is pulled up to the power source VCC by the resistor R20 and hence only the output terminal of the buffer IC20 takes an H level. Therefore, the respective bit values of the trimming object circuit 20a are set to {trim2, trim1, trim0}={0, 0, 1}, and in this way, the electric property of a trimming object is corrected.

FIG. 3 illustrates an exemplary configuration of a trimming circuit. The configuration of a conventional trimming circuit, disclosed in Japanese Laid-open Patent Publication No. 05-63090, capable of estimating an after-fuse-cutting state before the fuse cutting is illustrated.

A trimming circuit 30 includes a trimming object circuit 30a, resistors R30 to R34, fuses f30 to f32, inverters IC30 to IC32 and IC38, buffers IC33 and IC34, flip-flops IC35 to IC37, selector elements IC39 to IC41, and pads P10 to P14.

Here, a shift register 30b has the flip-flops IC35 to IC37 and a selector 30c has the inverter IC38 and the selector elements IC39 to IC41. Further, each of the selector elements IC39 to IC41 has two AND elements and one NOR element.

The connection relationship between the constituent elements is as follows. The pad P10 is connected to one end of the fuse f30, one end of the resistor R30, and an input terminal of the inverter IC30, the other end of the fuse f30 is connected to GND, and the other end of the resistor R30 is connected to a power source VCC.

The pad P11 is connected to one end of the fuse f31, one end of the resistor R31, and an input terminal of the inverter IC31, the other end of the fuse f31 is connected to GND, and the other end of the resistor R31 is connected to the power source VCC.

The pad P12 is connected to one end of the fuse f32, one end of the resistor R32, and an input terminal of the inverter IC32, the other end of the fuse f32 is connected to GND, and the other end of the resistor R32 is connected to the power source VCC.

The pad P13 is connected to one end of the resistor R33 and an input terminal of the buffer IC33, and the other end of the resistor R33 is connected to GND.

The pad P14 is connected to one end of the resistor R34 and an input terminal of the buffer IC34, and the other end of the resistor R34 is connected to GND.

An output terminal of the inverter IC30 is connected to an input terminal a4 of the selector element IC39, an output terminal of the inverter IC31 is connected to an input terminal a4 of the selector element IC40, and an output terminal of the inverter IC32 is connected to an input terminal a4 of the selector element IC41.

An output terminal of the buffer IC33 is connected to clock terminals (C) of the flip-flops IC35 to IC37, an input terminal of the inverter IC38, and input terminals a2 of the selector elements IC39 to IC41.

An output terminal of the buffer IC34 is connected to an input terminal (D) of the flip-flop IC37. An output terminal of the inverter IC38 is connected to input terminals a3 of the selector elements IC39 to IC41.

An output terminal (QN) of the flip-flop IC35 is connected to an input terminal a1 of the selector element IC39, and an input terminal (D) of the flip-flop IC35 is connected to an output terminal (QN) of the flip-flop IC36 and an input terminal a1 of the selector element IC40. An input terminal (D) of the flip-flop IC36 is connected to an output terminal (Q) of the flip-flop IC37. Output terminals of the selector elements IC39 to IC41 are connected to terminals trim0 to trim2 of the trimming object circuit 30a, respectively.

The trimming circuit 30 of such a configuration sends data to the shift register 30b by changing the voltage of the pad P13 from an L level to an H level, selects an output of the shift register 30b by the selector 30c, and sends the output to the trimming object circuit 30a. As a result, the state of the trimming object circuit 30a after fuse cutting may be estimated without cutting a fuse.

Here, the trimming circuit 20 illustrated in FIG. 2 may not estimate an after-fuse-cutting state before the fuse cutting. Consequently, an electric property may not necessarily fall within a standard after fuse cutting, which may result in a reduced manufacturing yield rate.

In contrast, the trimming circuit 30 illustrated in FIG. 3 allows an after-fuse-cutting state to be preliminarily estimated. In such a circuit configuration, however, an increase of the bit width of the trimming object circuit 30a causes increases in the number of flip-flops in the shift register 30b and in the number of selector elements in the selector 30c, accompanied with an increase of the number of pads as well. An increase of the number of pads, i.e., external input terminals causes a chip area to increase.

Note that the problem of the circuit configuration disclosed in Japanese Laid-open Patent Publication No. 05-63090 has heretofore been described and the problem of the circuit configuration disclosed in Japanese Laid-open Patent Publication No. 2010-267922 is likewise that, when the bit width of the trimming object circuit increases, the number of pads, i.e., external input terminals, increases and a chip area also increases.

The embodiments discussed herein are established in view of such aspects and provide a trimming apparatus that may improve a yield and may reduce a chip area even when a bit width to be set for a trimming object increases.

Second Embodiment

Figure 4:
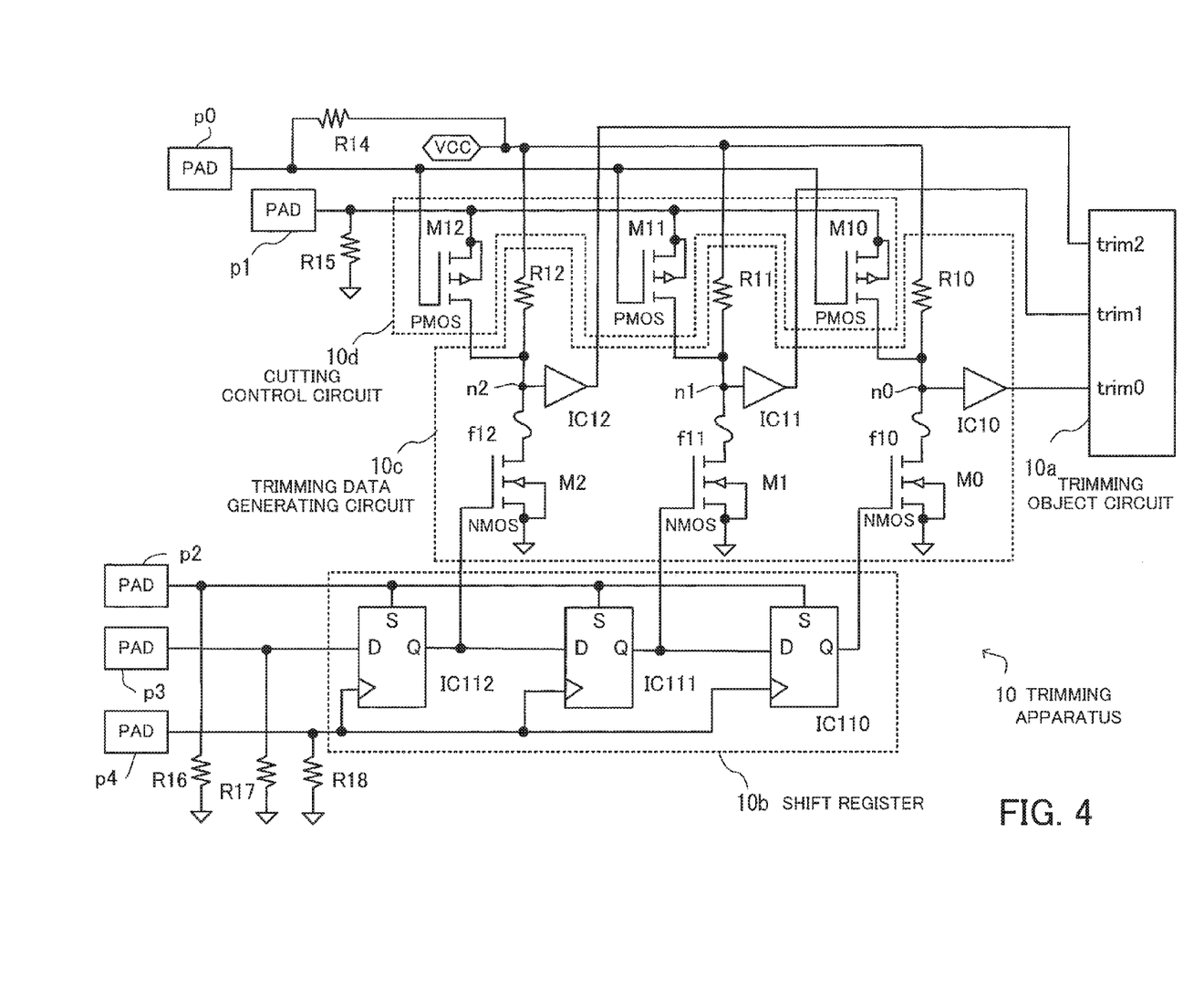
FIG. 4 illustrates an exemplary configuration of a trimming apparatus.

A trimming apparatus according to a second embodiment is hereunder explained in detail. FIG. 4 illustrates an exemplary configuration of a trimming apparatus. A trimming apparatus 10 according to the second embodiment includes a 3-bit (trim0 to trim2) trimming object circuit 10a, a shift register 10b, a trimming data generating circuit 10c, and a cutting control circuit 10d.

The shift register 10b includes flip-flops IC110 to IC112. The trimming data generating circuit 10c includes resistors R10 to R12, fuses f10 to f12, buffers IC10 to IC12, and transistors M0 to M2. The cutting control circuit 10d includes transistors M10 to M12.

A pad p0 is a control signal input pad which receives input of a control signal for fuse cutting, a pad p1 is a voltage applying pad for fuse cutting (electric signal input pad), and a pad p2 is a set disable signal input pad of the shift register 10b.

Further, a pad p3 is a data input pad, and a pad p4 is a clock input pad. Here, prescribed values are set in data to be input to the pads p0 to p4, by an upper device (processor or the like) not illustrated in FIG. 4.

The resistors R10 to R12 and R14 are pull-up resistors and resistors R15 to R18 are pull-down resistors. The flip-flops IC110 to IC112 are D-type flip-flops and constitute shift register functions.

The transistors M0 to M2 are NMOS (N-Channel Metal Oxide Semiconductor) transistors and the transistors M10 to M12 are PMOS (P-Channel MOS) transistors. They are hereunder referred to as NMOS transistors M0 to M2 and PMOS transistors M10 to M12, respectively.

The connection relationship between the constituent elements is as follows. A power source VCC is connected to one ends of the resistors R10 to R12 and R14. The pad p0 is connected to the other end of the resistor R14 and the gates of the PMOS transistors M10 to M12. The pad p1 is connected to one end of the resistor R15 and the sources of the PMOS transistors M10 to M12, and the other end of the resistor R15 is connected to GND.

The drain of the PMOS transistor M10 is connected to the other end of the resistor R10, an input terminal of the buffer IC10, and one end of the fuse f10. The drain of the PMOS transistor M11 is connected to the other end of the resistor R11, an input terminal of the buffer IC11, and one end of the fuse f11. The drain of the PMOS transistor M12 is connected to the other end of the resistor R12, an input terminal of the buffer IC12, and one end of the fuse f12.

An output terminal of the buffer IC10 is connected to the terminal trim0 of the trimming object circuit 10a, an output terminal of the buffer IC11 is connected to the terminal trim1 of the trimming object circuit 10a, and an output terminal of the buffer IC12 is connected to the terminal trim2 of the trimming object circuit 10a.

The drain of the NMOS transistor M0 is connected to the other end of the fuse f10, and the source of the NMOS transistor M0 is connected to GND. The drain of the NMOS transistor M1 is connected to the other end of the fuse f11, and the source of the NMOS transistor M1 is connected to GND. The drain of the NMOS transistor M2 is connected to the other end of the fuse f12, and the source of the NMOS transistor M2 is connected to GND.

The pad p2 is connected to one end of the resistor R16 and set terminals (S) of the flop-flops IC110 to IC112, and the other end of the resistor R16 is connected to GND. The pad p3 is connected to one end of the resistor R17 and an input terminal (D) of the flip-flop IC112, and the other end of the resistor R17 is connected to GND. The pad p4 is connected to one end of the resistor R18 and clock terminals (C) of the flop-flops IC110 to IC112, and the other end of the resistor R18 is connected to GND.

An output terminal (Q) of the flip-flop IC110 is connected to a gate of the NMOS transistor M0. An output terminal (Q) of the flip-flop IC111 is connected to a gate of the NMOS transistor M1 and an input terminal (D) of the flip-flop IC110. An output terminal (Q) of the flip-flop IC112 is connected to a gate of the NMOS transistor M2 and an input terminal (D) of the flip-flop IC111.

Operations of the apparatus will be explained below. The operation mode of the trimming apparatus 10 is divided into three phases: a trimming estimation phase, a fuse cutting phase, and an actual operation phase.

The trimming estimation phase is a phase for estimating an after-fuse-cutting state before the fuse is actually cut. The fuse cutting phase is a phase for cutting a prescribed fuse. The actual trimming phase is an operation phase in a state after trimming is performed in the fuse cutting phase. The phases will be explained hereunder.

(Trimming Estimation Phase)

The PMOS transistors M10 to M12 are turned off, and data and a clock are inputted to the shift register 10b. The data is inputted through the pad p3 and the clock is inputted through the pad p4 to the shift register 10b.

In the case where the outputs of the flip-flops IC110 to IC112 included in the shift register 10b are at an H level when the shift register 10b receives the data and the clock, H level signals (corresponding to first-level setting data) are applied to the gates of the NMOS transistors M0 to M2.

In this instance, since the NMOS transistors M0 to M2 connected to the GND side of the fuses f10 to f12 are turned on, nodes n0 to n2 conduct to the GND side and the outputs of the buffers IC10 to IC12 take an L level. Consequently, the respective bit values of the trimming object circuit 10a are given as {trim2, trim1, trim0}={0, 0, 0}.

In contrast, when the outputs of the flip-flops IC110 to IC112 are L level signals (corresponding to second-level setting data), the L levels are applied to the gates of the NMOS transistors M0 to M2.

In this instance, the NMOS transistors M0 to M2 are turned off, the nodes n0 to n2 are pulled up to the power source VCC, and hence the outputs of the buffers IC10 to IC12 take the H level. Consequently, the respective bit values of the trimming object circuit 10a are given as {trim2, trim1, trim0}={1, 1, 1}.

As thus described, inputting prescribed serial data through the pad p3 and changing an output level (level of setting data) of the shift register 10b allows H- or L-level signals to be inputted to the terminals trim0 to trim2 of the trimming object circuit 10a.

As a result, an optimum combination of the respective bit values (trim0 to trim2) of the trimming object circuit 10a after fuse cutting may be preliminarily found before fuse cutting.

(Fuse Cutting Phase)

In the fuse cutting phase, output of the shift register 10b is first inverted. For example, it is assumed that the bit values to be set in the trimming object circuit 10a has been estimated to be {trim2, trim1, trim0}={0, 1, 0} in the trimming estimation phase.

Here, when {trim2, trim1, trim0}={0, 1, 0} is settled, the outputs of the shift register 10b are {1, 0, 1}. That is to say, the outputs of the flip-flops IC110 to IC112 are {1, 0, 1} in the trimming estimation phase.

As a result, in the fuse cutting phase, serial data of {0, 1, 0} obtained by inverting the outputs {1, 0, 1} of the shift register 10b is inputted to the shift register 10b through the pad p3, and {0, 1, 0} are outputted from the shift register 10b.

Here, since the gates of the NMOS transistors M0 and M2 take the L level and the gate of the NMOS transistor M1 takes the H level, the NMOS transistor M1 turns into an ON state, whereas the NMOS transistors M0 and M2 turn into an OFF state.

Subsequently, a control signal of the L level is inputted to the pad p0, all of the PMOS transistors M10 to M12 corresponding to fuse cutting switches are turned on, and moreover, an electric signal for fuse cutting is inputted to the pad p1.

Here, among the NMOS transistors M0 to M2, the NMOS transistors M0 and M2 have been turned off, and therefore an electric signal for fuse cutting does not flow in the fuses f10 and f12 connected to the NMOS transistors M0 and M2, and the fuses f10 and f12 remain connected (uncut).

In contrast, among the NMOS transistors M0 to M2, the NMOS transistor M1 has been turned on, and therefore an electric signal for fuse cutting flows in the fuse f11 connected to the NMOS transistor M1, and only the fuse f11 is cut.

(Actual Operation Phase)

The PMOS transistors M10 to M12 are turned off. Meanwhile, the set function of the shift register 10b is active low and the set terminals (S) of the flip-flops IC110 to IC112 are pulled down by the resistor R16.

As a result, when an H-level set disable signal is not inputted through the pad p2, all of the outputs of the flip-flops IC110 to IC112 are maintained at the H level. Here, all of the NMOS transistors M0 to M2 connected to the GND side of the fuses f10 to f12 turn into the ON state.

Consequently, among the fuses f10 to f12, the fuses f10 and f12 are uncut, the nodes n0 and n2 turn into the state of conducting to the GND side, hence the nodes n0 and n2 take the L level, and L-level trimming data is outputted from the buffers IC10 and IC12.

Further, the fuse f11 is cut, the node n1 turns into the Pulled-up state, hence the node n1 takes the H level, and H-level trimming data is outputted from the buffer IC11.

That is to say, operation may be performed by fixing the bit values {trim2, trim1, trim0} of the trimming object circuit 10a to {0, 1, 0} that are desired values estimated in the trimming estimation phase.

There will be explained below a configuration of the trimming apparatus according to the embodiment in which the number of pads does not increase even when the bit width of a trimming object increases.

Figure 5:
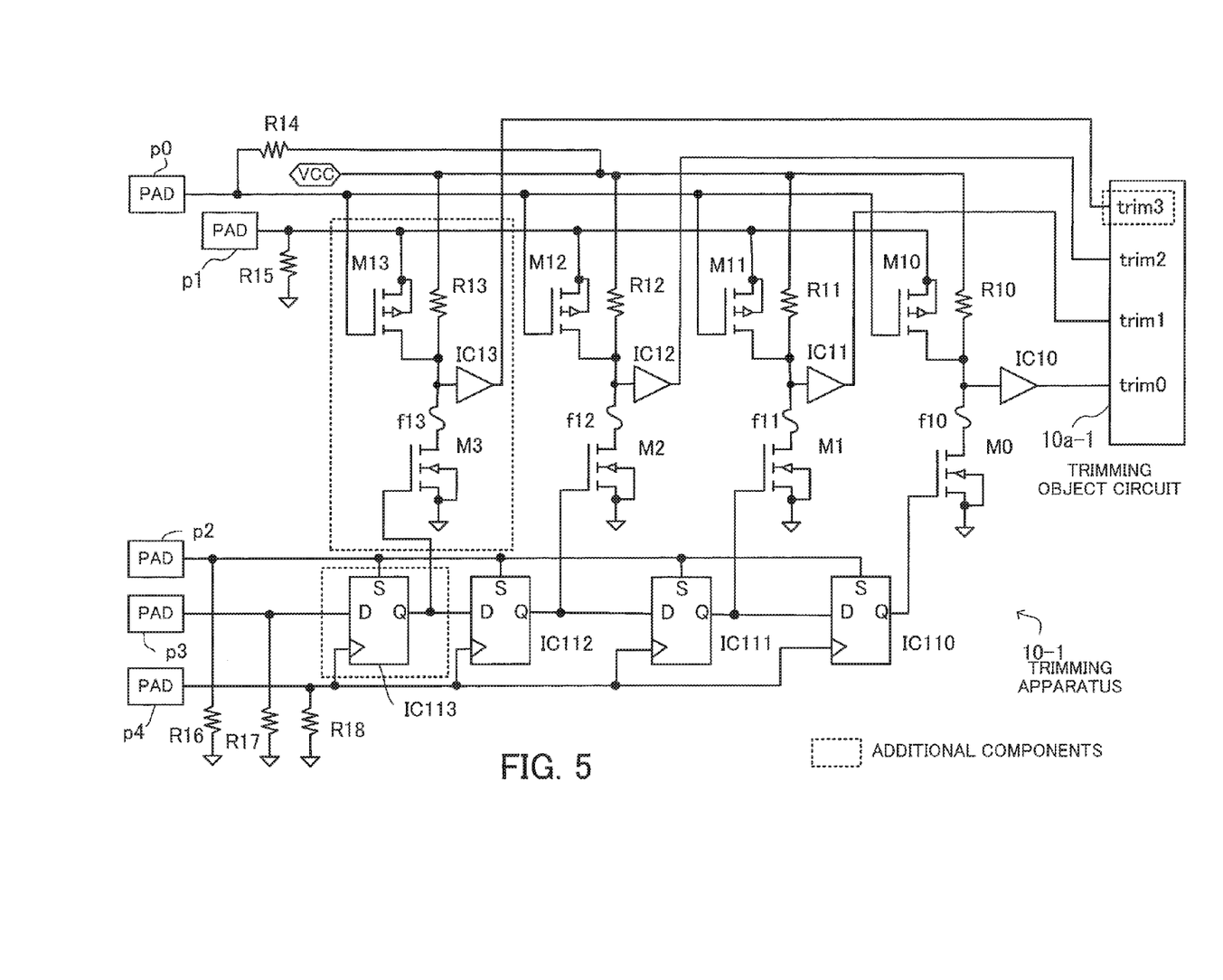
FIG. 5 illustrates an exemplary configuration of a trimming apparatus having an increased bit width.

FIG. 5 illustrates an exemplary configuration of a trimming apparatus having an increased bit width. Although the trimming apparatus 10 illustrated in FIG. 4 has the 3-bit trimming object circuit 10a, a trimming apparatus 10-1 has a 4-bit trimming object circuit 10a-1, i.e., the bit width being increased by one.

In FIG. 5, the components surrounded by the dotted-line square frames are components newly added in response to the addition of one bit. The constituent elements newly added to the trimming apparatus 10 of FIG. 4 are a resistor R13, a PMOS transistor M13, a buffer IC13, a fuse f13, an NMOS transistor M3, and a flip-flop IC113.

Only the connection relationship between the added constituent elements is as follows. An end of the resistor R13 is connected to a power source VCC, an end of a resistor R14, and one ends of resistors R10 to R12 and the other end of the resistor R13 is connected to the drain of the PMOS transistor M13, an input terminal of the buffer IC13, and one end of the fuse f13.

The gate of the PMOS transistor M13 is connected to a pad p0, the other end of the resistor R14, and the gates of PMOS transistors M10 to M12. The source of the PMOS transistor M13 is connected to a pad p1, an end of a resistor R15, and the sources of the PMOS transistors M10 to M12.

The other end of the fuse f13 is connected to the drain of the NMOS transistor M3, and the source of the NMOS transistor M3 is connected to GND. An output terminal of the buffer IC13 is connected to a terminal trim3 of the trimming object circuit 10a-1. A gate of the NMOS transistor M3 is connected to an input terminal (D) of a flip-flop IC112 and an output terminal (Q) of the flip-flop IC113.

An input terminal (D) of the flip-flop IC113 is connected to a pad p3 and an end of a resistor R17, and a set terminal (S) of the flip-flop IC113 is connected to a pad p2 and set terminals (S) of the flip-flops IC110 to IC112.

Here, in the trimming apparatus 10-1, although the bit width of a trimming object increases in comparison with the trimming apparatus 10 of FIG. 4, the above addition of the constituent elements as surrounded by the dotted-line frames is sufficient to deal with the increase in the bit width, and therefore it is not needed to change the number (=5) of pads.

In this way, in the trimming apparatus according to the embodiment, a circuit configuration not allowing the number of pads to increase even when the bit width of a trimming object increases is obtained and hence a chip area may reduce.

Third Embodiment

Figure 6:
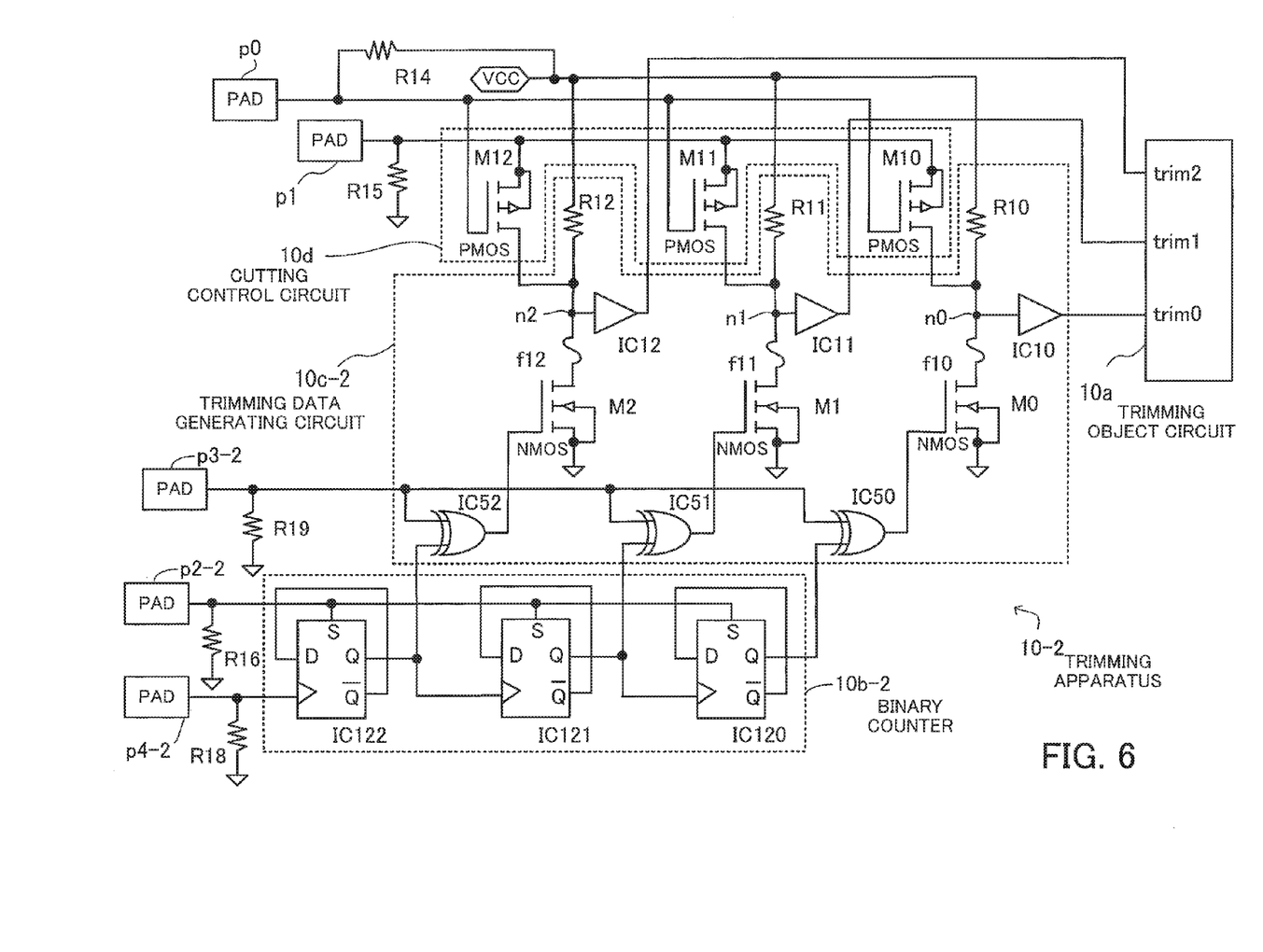
FIG. 6 illustrates an exemplary configuration of a trimming apparatus.

FIG. 6 illustrates an exemplary configuration of a trimming apparatus. A trimming apparatus 10-2 according to a third embodiment includes a 3-bit (trim0 to trim2) trimming object circuit 10a, a binary counter 10b-2, a trimming data generating circuit 10c-2, and a cutting control circuit 10d.

The circuit sections different from the trimming apparatus 10 of FIG. 4 are the binary counter 10b-2 and the trimming data generating circuit 10c-2. In the trimming apparatus 10-2, the binary counter 10b-2 is used instead of the shift register 10b illustrated in FIG. 4. Further, the new trimming data generating circuit 10c-2 is configured by adding EXCLUSIVE-OR elements (hereunder XOR elements) IC50 to IC52, each of the XOR elements having two inputs and one output, as circuit elements to the trimming data generating circuit 10c illustrated in FIG. 4. The other circuit configurations are identical to FIG. 4 and hence the explanations are made while attention is hereunder focused on the different components.

The binary counter 10b-2 includes flip-flops IC120 to IC122. The trimming data generating circuit 10c-2 includes resistors R10 to R12, fuses f10 to f12, buffers IC10 to IC12, NMOS transistors M0 to M2, and the XOR elements IC50 to IC 52. The cutting control circuit 10d includes PMOS transistors M10 to M12.

A pad p0 is a control signal input pad which receives input of a control signal for fuse cutting, and a pad p1 is a voltage application pad for fuse cutting. Further, a pad p2-2 is a set disable signal input pad to input a set disable signal to the binary counter 10b-2.

A pad p3-2 is a pad (polarity control data input pad) to input polarity control data (binary counter output inversion signal) to invert or non-invert polarities of setting data outputted from the binary counter 10b-2.

A pad p4-2 is a clock input pad to input a clock to the binary counter 10b-2. Here, prescribed values are set in the data to be inputted to the pads by upper devices not illustrated in FIG. 6.

The connection relationship in the vicinity of the binary counter 10b-2 is as follows. The pad p2-2 is connected to an end of a resistor R16 and set terminals (S) of the flip-flops IC120 to IC122, and the other end of the resistor R16 is connected to GND. The pad p3-2 is connected to an end of a resistor R19 and an input terminal of each of the XOR elements IC50 to IC52, and the other end of the resistor R19 is connected to GND.

The pad p4-2 is connected to an end of a resistor R18 and a clock terminal of the flip-flop IC122, and the other end of the resistor R18 is connected to GND.

An output terminal (Q) of the flip-flop IC120 is connected to another input terminal of the XOR element IC50. An output terminal (Q) of the flip-flop IC121 is connected to another input terminal of the XOR element IC51 and a clock terminal of the flip-flop IC120. An output terminal (Q) of the flip-flop IC122 is connected to another input terminal of the XOR element IC52 and a clock terminal of the flip-flop IC121.

An input terminal (D) of the flip-flop IC120 is connected to an output terminal (QN) of the flip-flop IC120, an input terminal (D) of the flip-flop IC121 is connected to an output terminal (QN) of the flip-flop IC121, and an input terminal (D) of the flip-flop IC122 is connected to an output terminal (QN) of the flip-flop IC122.

An output terminal of the XOR element IC50 is connected to the gate of the NMOS transistor M0, an output terminal of the XOR element IC51 is connected to the gate of the NMOS transistor M1, and an output terminal of the XOR element IC52 is connected to the gate of the NMOS transistor M2.

As stated above, in the trimming apparatus 10-2, the NMOS transistors (trimming estimation MOSs) M0 to M2 are connected to the GND side of the fuses f10 to f12, respectively, and moreover, the output terminals of the XOR elements IC50 to IC52 are connected to the gates of the NMOS transistors M0 to M2, respectively.

Subsequently, one of the input terminals of each of the XOR elements IC50 to IC52 is connected to the pad p3-2 to receive input of a binary counter output inversion signal, and the other input terminals of the XOR elements IC50 to IC52 are connected to the output terminals (Q) of the binary counter 10b-2, respectively, to receive input of setting data representing count-up values outputted from the binary counter 10b-2.

In such a configuration, a state where the fuses f10 to f12 are uncut is created when the NMOS transistors M0 to M2 are turned on, and a state equivalent to a state where the fuses f10 to f12 have been cut is created when the NMOS transistors M0 to M2 are turned off.

Moreover, by inputting a clock through the pad p4-2 after the setting of the binary counter 10b-2 is cancelled, the binary counter 10b-2 may scan all bit patterns in the state where all the bits (all setting data) take the H level to the L level. As a result, it becomes possible to estimate all possible combinations of the fuses f10 to f12 being cut or uncut, thereby facilitating a search for a combination of fuse cutting that provides an optimum electric property value of the trimming object circuit 10a.

Operations of the trimming apparatus 10-2 will be explained hereunder. The operation mode of the trimming apparatus 10-2 is divided into three phases: a trimming estimation phase, a fuse cutting phase, and an actual operation phase, as with the trimming apparatus 10 illustrated in FIG. 4. The phases will be explained hereunder.

(Trimming Estimation Phase)

A set disable signal is set to the H level through the pad p2-2, and a binary counter output inversion signal is fixed to the L level through the pad p3-2 (first polarity control data is inputted to the pad p3-2). In the state, a clock is inputted to the binary counter 10b-2 through the pad P4-2. In the state, the levels of the output signals (logic signals) of the XOR elements IC50 to IC52 are identical to the output levels of the binary counter 10b-2.

As a result, when setting data (also referred to as Q outputs hereunder) outputted from the output terminals (Q) of the flip-flops IC120 to IC122 included in the binary counter 10*b*-2 are at the H level, the XOR elements IC50 to IC52 also output the H level (first level) and hence the NMOS transistors M0 to M2 that are trimming estimation MOSs are turned on.

Therefore, the relevant bit outputs (signals inputted to the trimming object circuit 10*a*) when the NMOS transistors M0 to M2 are at the L level, here.

In contrast, when the Q outputs of the flip-flops IC120 to IC122 are at the L level, the XOR elements IC50 to IC52 also output the L level (second level) and hence the NMOS transistors M0 to M2 are turned off. Therefore, the relevant bit outputs are at the H level, here.

As thus described, fixing the binary counter output inversion signal to the L level allows an H- or L-level signal to be inputted to the trimming object circuit 10*a* due to the change of the output level caused by the binary count-up by the binary counter 10*b*-2. As a result, an optimum combination to cut the fuses f10 to f12 may be preliminarily found before fuse cutting.

For example, all the combinations of the H and L levels may be scanned using 8 clocks when the binary counter is 3 bits and using 16 clocks when the binary counter is 4 bits.

Figure 7:
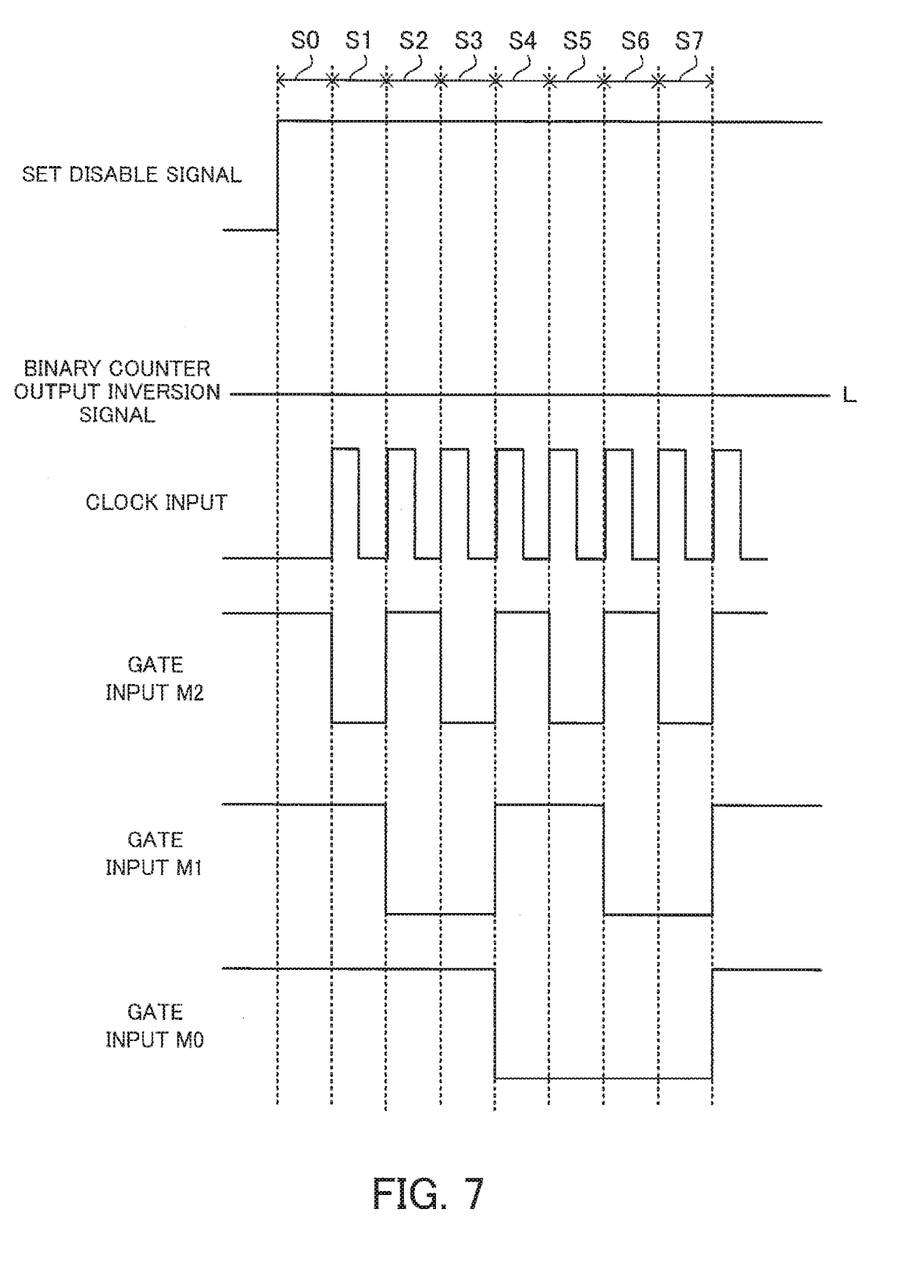
FIG. 7 is a time chart representing a gate input state of trimming estimation MOSs.

FIG. 7 is a time chart representing the gate input state of the trimming estimation MOSs. The gate input state of the NMOS transistors M0 to M2 in a trimming estimation phase is represented. In the trimming estimation phase, a set disable signal is set to the H level, a binary counter output inversion signal is set to the L level, and a clock is inputted to the binary counter 10*b*-2.

(S0) The set disable signal is at the H level but the clock, which has not been inputted, is at the L level. Consequently, the Q outputs of the flip-flops IC120 to IC122 are at the H level.

Further, since the binary counter output inversion signal is at the L level, the outputs of the XOR elements IC50 to IC52 are at the H level and the gate inputs of the NMOS transistors M0 to M2 are at the H level.

Consequently, the NMOS transistors M0 to M2 are turned on and the buffers IC10 to IC12 output the L level. Here, in the trimming estimation phase, since the Q output levels of the flip-flops IC120 to IC122 are identical to the gate input levels of the NMOS transistors M0 to M2, only the gate input levels of the NMOS transistors M0 to M2 are described hereunder.

(S1) During the first clock, the gate input (gate input M0) of the NMOS transistor M0 takes the H level, the gate input (gate input M1) of the NMOS transistor M1 takes the H level, and the gate input (gate input M2) of the NMOS transistor M2 takes the L level.

Here, the NMOS transistor M0 is turned on, the NMOS transistor M1 is turned on, and the NMOS transistor M2 is turned off. Consequently, the buffer IC10 outputs the L level, the buffer IC11 outputs the L level, and the buffer IC12 outputs the H level.

(S2) During the second clock, the gate input of the NMOS transistor M0 takes the H level, the gate input of the NMOS transistor M1 takes the L level, and the gate input of the NMOS transistor M2 takes the H level.

Here, the NMOS transistor M0 is turned on, the NMOS transistor M1 is turned off, and the NMOS transistor M2 is turned on. Consequently, the buffer IC10 outputs the L level, the buffer IC11 outputs the H level, and the buffer IC12 outputs the L level.

(S3) During the third clock, the gate input of the NMOS transistor M0 takes the H level, the gate input of the NMOS transistor M1 takes the L level, and the gate input of the NMOS transistor M2 takes the L level.

Here, the NMOS transistor M0 is turned on, the NMOS transistor M1 is turned off, and the NMOS transistor M2 is turned off. Consequently, the buffer IC10 outputs the L level, the buffer IC11 outputs the H level, and the buffer IC12 outputs the H level.

(S4) During the fourth clock, the gate input of the NMOS transistor M0 takes the L level, the gate input of the NMOS transistor M1 takes the H level, and the gate input of the NMOS transistor M2 takes the H level.

In this instance, the NMOS transistor M0 is turned off, the NMOS transistor M1 is turned on, and the NMOS transistor M2 is turned on. Consequently, the buffer IC10 outputs the H level, the buffer IC11 outputs the L level, and the buffer IC12 outputs the L level.

(S5) During the fifth clock, the gate input of the NMOS transistor M0 takes the L level, the gate input of the NMOS transistor M1 takes the H level, and the gate input of the NMOS transistor M2 takes the L level.

Here, the NMOS transistor M0 is turned off, the NMOS transistor M1 is turned on, and the NMOS transistor M2 is turned off. Consequently, the buffer IC10 outputs the H level, the buffer IC11 outputs the L level, and the buffer IC12 outputs the H level.

(S6) During the sixth clock, the gate input of the NMOS transistor M0 takes the L level, the gate input of the NMOS transistor M1 takes the L level, and the gate input of the NMOS transistor M2 takes the H level.

Here, the NMOS transistor M0 is turned off, the NMOS transistor M1 is turned off, and the NMOS transistor M2 is turned on. Consequently, the buffer IC10 outputs the H level, the buffer IC11 outputs the H level, and the buffer IC12 outputs the L level.

(S7) During the seventh clock, the gate input of the NMOS transistor M0 takes the L level, the gate input of the NMOS transistor M1 takes the L level, and the gate input of the NMOS transistor M2 takes the L level.

Here, the NMOS transistor M0 is turned off, the NMOS transistor M1 is turned off, and the NMOS transistor M2 is turned off. Consequently, the buffer IC10 outputs the H level, the buffer IC11 outputs the H level, and the buffer IC12 outputs the H level.

Here, when the Q outputs of the flip-flops IC120 to IC122 included in the binary counter 10*b*-2 are at the H level, the NMOS transistors M0 to M2 are turned on and the outputs of the buffers IC10 to IC12 take the L level. This state is equivalent to the state of the fuses f10 to f12 being uncut.

Meanwhile, when the Q outputs of the flip-flops IC120 to IC122 are at the L level, the NMOS transistors M0 to M2 are turned off and the outputs of the buffers IC10 to IC12 take the H level. This state is equivalent to the state of the fuses f10 to f12 being cut.

In this way, an optimum combination state for the bit values (trim0 to trim2) of the trimming object circuit 10*a* after fuse cutting may be preliminarily found before fuse cutting.

(Fuse Cutting Phase)

When an electric property value of the trimming object circuit 10*a* is in the optimized state, the clock inputted to the binary counter 10*b*-2 is stopped and the binary counter output inversion signal is changed from the L level to the H level (second polarity control data is inputted to the pad p3-2).

As a result, the polarities of the gate inputs of the NMOS transistors M0 to M2 are inverted. Subsequently, all of the PMOS transistors M10 to M12 (fuse cutting switches) are turned on and voltage for fuse cutting is applied to the pad p1. Consequently, electric current flows only in the NMOS transistors that were turned off (equivalent to fuses being cut) during trimming estimation, and only desired fuses may be cut.

Figure 8:
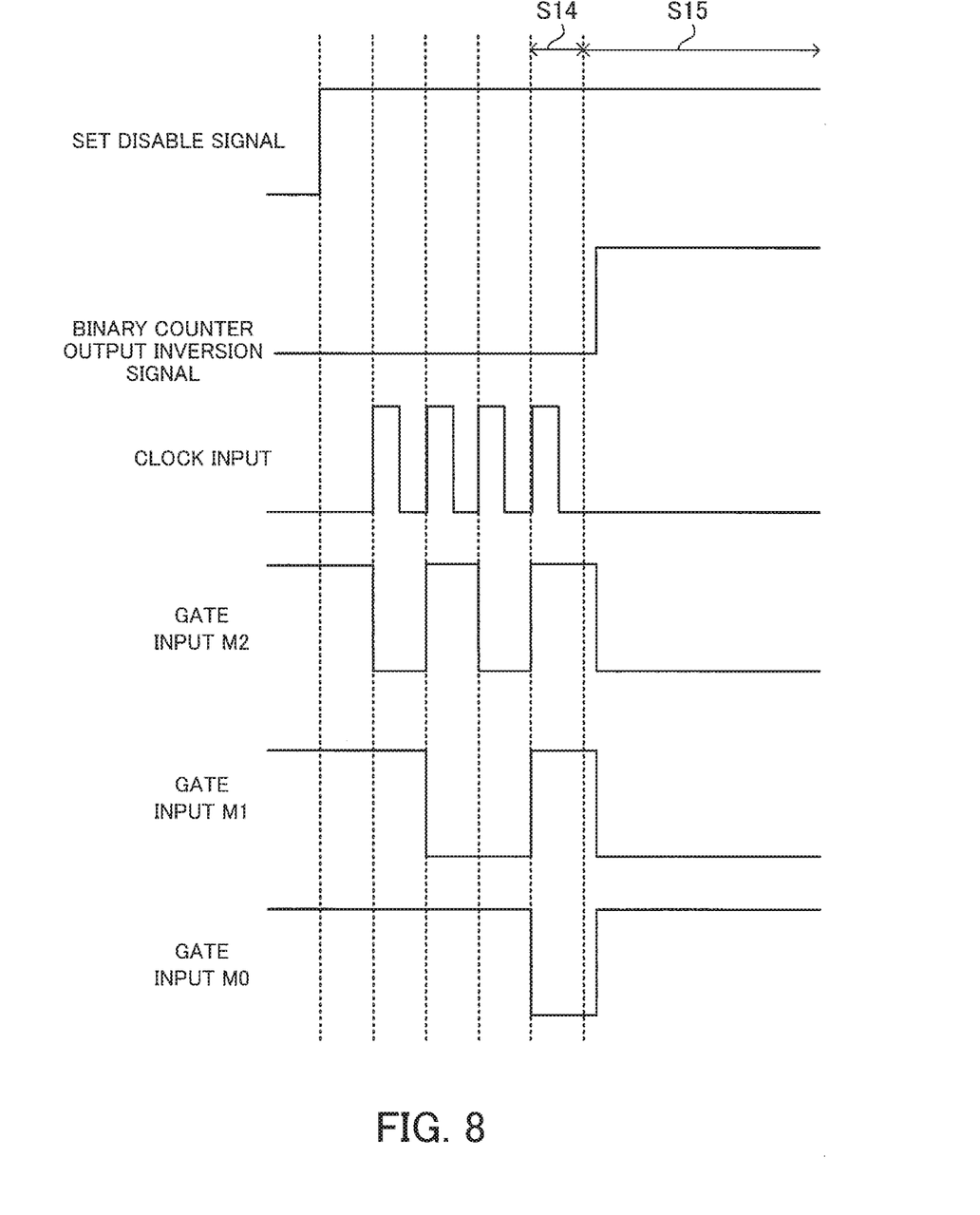
FIG. 8 is a time chart representing a gate input state of trimming estimation MOSs.

FIG. 8 is a time chart representing the gate input state of the trimming estimation MOSs. The gate input state of the NMOS transistors M0 to M2 in a fuse cutting phase is represented. In the fuse cutting phase, a binary counter output inversion signal is set to the H level, and moreover, a clock input is stopped.

In FIG. 8, as an example of fuse cutting, the operation when cutting only the fuse f10 is illustrated. That is to say, there is illustrated a case in the trimming estimation phase where an electric property value of the trimming object circuit 10a is confirmed to be optimized when the trimming data inputted to the trimming object circuit 10a is {trim2, trim1, trim0}={0, 0, 1}.

(S14) During the fourteenth clock, the gate input of the NMOS transistor M0 takes the L level, the gate input of the NMOS transistor M1 takes the H level, and the gate input of the NMOS transistor M2 takes the H level.

Here, the NMOS transistor M0 is turned off, the NMOS transistor M1 is turned on, and the NMOS transistor M2 is turned on. Consequently, the buffer IC10 outputs the H level, the buffer IC11 outputs the L level, and the buffer IC12 outputs the L level. Consequently, the trimming data inputted to the trimming object circuit 10a is {trim2, trim1, trim0}={0, 0, 1}.

(S15) At step S14, the gate input levels in the fourteenth clock are (gate input M2, gate input M1, gate input M0)=(H, H, L), and {trim2, trim1, trim0}={0, 0, 1} is obtained. Consequently, in the period corresponding to the fifteenth and subsequent clocks, the binary counter output inversion signal is set to the H level, and moreover, the clock input is stopped.

Subsequently, the polarities of the gate inputs of the NMOS transistors M0 to M2 are inverted and (gate input M2, gate input M1, gate input M0)=(L, L, H) is obtained. That is to say, the gate input of the NMOS transistor M0 takes the H level, the gate input of the NMOS transistor M1 takes the L level, and the gate input of the NMOS transistor M2 takes the L level.

Consequently, the NMOS transistor M0 is turned on, the NMOS transistor M1 is turned off, and the NMOS transistor M2 is turned off.

Subsequently, in this state, the PMOS transistors M10 to M12 are turned on by inputting a control signal for fuse cutting through the pad p0, and a prescribed voltage is applied through the pad p1. As a result, only the fuse f10 is cut and the fuses f11 and f12 turn into an uncut state.

(Actual Operation Phase)

In an actual operation, since the binary counter output inversion signal is pulled down by the resistor R19, the XOR elements IC50 to IC52 outputs the received outputs of the binary counter 10b-2 as they are.

Since the set disable signal of the binary counter 10b-2 is L active and is pulled down by the resistor R16, all the outputs of the binary counter 10b-2 take a set state (the H level) and all the NMOS transistors M0 to M2 are turned on.

Consequently, the L level is outputted from a relevant buffer in the bit of an uncut fuse and the H level is outputted from a relevant buffer in the bit of an already-cut fuse. As has been described above, a desirable operation after fuse trimming may be achieved.

Figure 9:
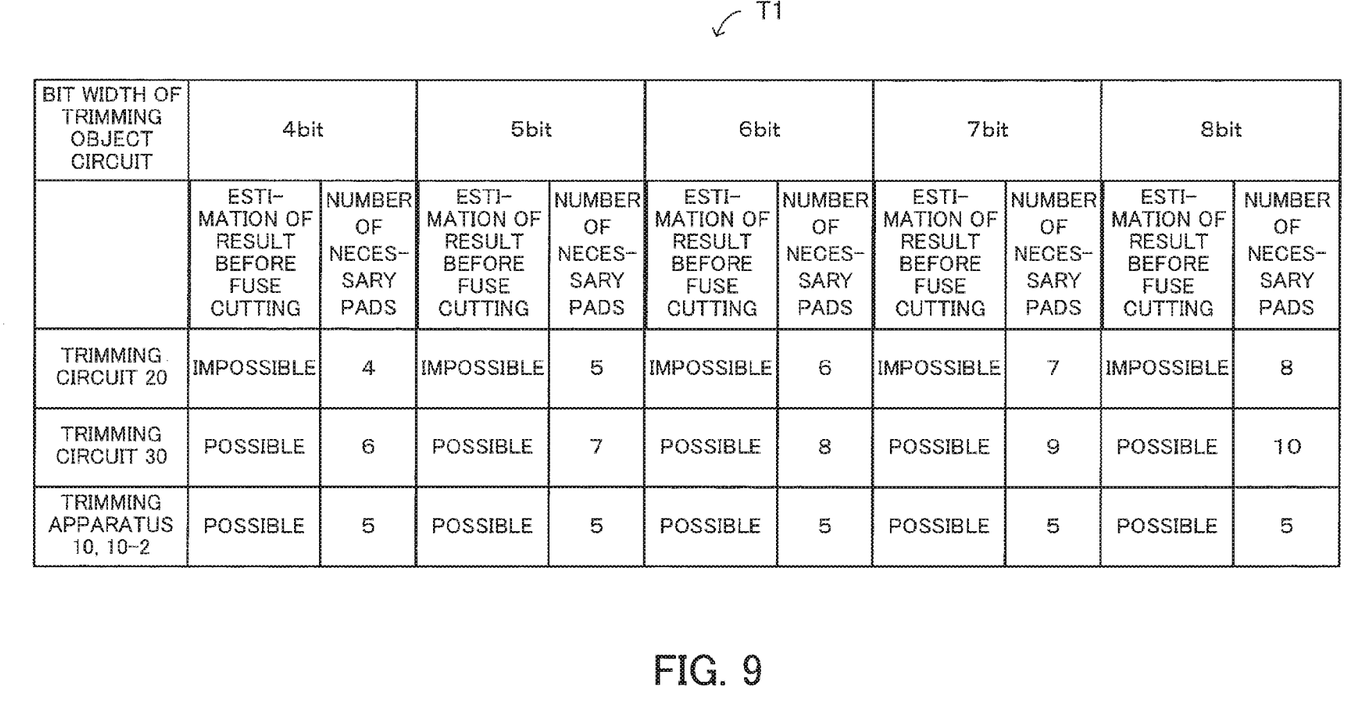
FIG. 9 is a table listing the results of relationship between "estimation of result before fuse cutting" and "number of pads"

The effects of the embodiments will be explained hereunder while the trimming apparatuses according to the embodiments and conventional technologies are compared. FIG. 9 is a table listing the results of relationship between "Estimation of result before fuse cutting" and "number of pads". The table T1 includes the description items of "Estimation of result before fuse cutting" and "Number of necessary pads" in a bit width of a trimming object circuit.

An impossible "Estimation of result before fuse cutting" means that an after-fuse-cutting state may not be estimated before fuse cutting. In contrast, a possible "Estimation of result before fuse cutting" means that an after-fuse-cutting state may be estimated before fuse cutting.

Here, in the trimming circuit 20 illustrated in FIG. 2, "Estimation of result before fuse cutting" is impossible and "Number of necessary pads" increases in accordance with an increase in the bit width of a trimming object.

Further, in the trimming circuit 30 illustrated in FIG. 3, although "Estimation of result before fuse cutting" is possible, "Number of necessary pads" increases in accordance with an increase in the bit width of the trimming object.

In contrast, in the trimming apparatus 10 according to the embodiment illustrated in FIG. 4 and the trimming apparatus 10-2 illustrated in FIG. 6, "Estimation of result before fuse cutting" is possible and "Number of necessary pads" remains five, meaning that the number of pads does not increase, even when the bit width of a trimming object increases.

Figure 10:
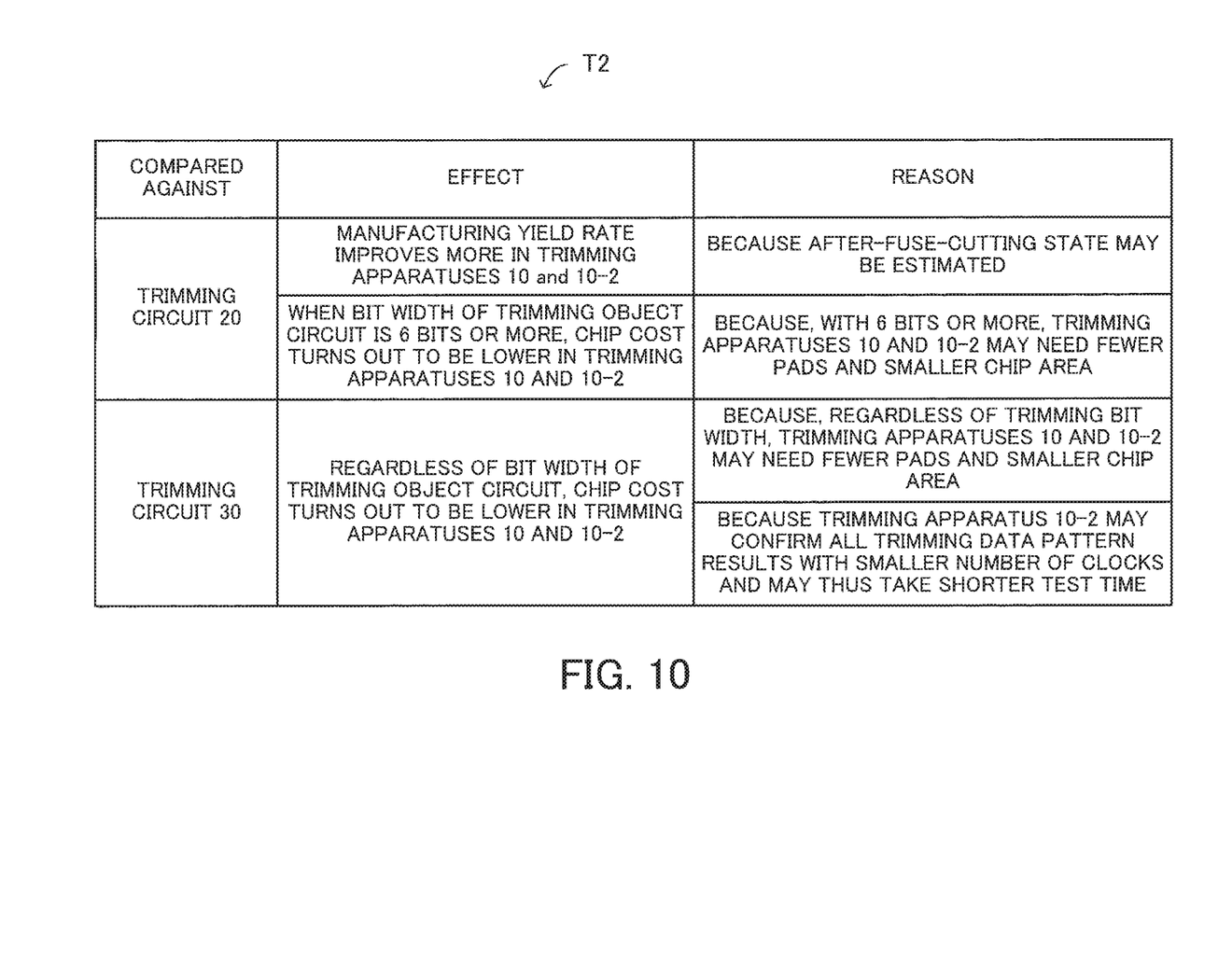
FIG. 10 is a table listing comparison results of effects.

FIG. 10 is a table listing comparison results of effects. In table T2, "Compared against", "Effect", and "Reason for effect" are described. The comparison of the trimming apparatuses 10 and 10-2 against the trimming circuit 20 indicates that the trimming apparatuses 10 and 10-2 improve manufacturing yield rates. This is because the after-fuse-cutting state may be estimated before cutting the fuse.

Furthermore, when the bit width of the trimming object is 6 bits or more, a chip cost turns out to be lower in the trimming apparatuses 10 and 10-2. The reason is that, when the bit width of a trimming object is 6 bits or more, the trimming apparatuses 10 and 10-2 use fewer pads than the trimming circuit 20, whereby the trimming apparatuses 10 and 10-2 need smaller chip areas.

Meanwhile, in the comparison of the trimming apparatuses 10 and 10-2 against the trimming circuit 30, the chip manufacturing cost turns out to be lower for the trimming apparatuses 10 and 10-2, regardless of the bit width of the trimming object circuit.

This is because, regardless of the bit width of the trimming object, the trimming apparatuses 10 and 10-2 need fewer pads than the trimming circuit 30, whereby the trimming apparatuses 10 and 10-2 need smaller chip areas. Furthermore, in the trimming apparatus 10-2 in particular, the reason is that the results of all trimming data patterns may be confirmed with a smaller number of clocks and hence the test time is shorter.

According to one aspect, it becomes possible to improve the manufacturing yield rate and reduce the chip area.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A trimming apparatus for adjusting an electric property value of a trimming object circuit, the trimming apparatus comprising:
    a data input pad that is a single pad and that receives an input of serial data;
    a shift register that outputs parallel setting data by shifting the serial data received through the data input pad;
    a trimming data generating circuit that includes
        a plurality of trimming elements, each having a conductive part that is cuttable by a flow of an electric signal,
        a plurality of pull-up resistors respectively connected to high potential sides of the trimming elements, and
        a plurality of switches respectively connected to low potential sides of the trimming elements,
    the trimming data generating circuit being configured to generate trimming data for the trimming object circuit by switching the plurality of switches in accordance with a level of the setting data; and
    a cutting control circuit that controls application of the electric signal to the trimming data generating circuit.

2. The trimming apparatus according to claim 1, wherein the trimming apparatus is configured to operate in one of three phases including:
    a trimming estimation phase in which
        the serial data received by the data input pad is serial data for estimation,
        the cutting control circuit stops applying the electric signal,
        the shift register shifts the received serial data for estimation to output the setting data, and
        the switches are turned on, when the setting data is at a first level, to output the trimming data at a low potential level, and are turned off, when the setting data is at a second level, to output the trimming data at a high potential level,
    to thereby preliminarily estimate a state of the trimming object circuit after trimming elements cutting;
    a trimming element cutting phase in which, for a prescribed one of the trimming elements,
        the cutting control circuit applies the electric signal, and
        the shift register outputs the setting data at the first level to one of the switches connected to the prescribed trimming element to turn on the one switch, so that the electric signal flows through the prescribed trimming element to cut the prescribed trimming element; and
    an actual operation phase in which,
        the cutting control circuit stops applying the electric signal, and
        the shift register outputs the setting data at the first level from all output terminals of the shift register to turn on all of the switches, so that the trimming data at the low potential level is output from an uncut one of the trimming elements, and the trimming data at the high potential level is output from an already-cut one of the trimming elements,
    to thereby perform an actual operation after the trimming element cutting phase.

3. The trimming apparatus according to claim 2, wherein the serial data received by the data input pad in the trimming element cutting phase is obtained by inverting logic values of the setting data outputted from the shift register when a bit width to be set to the trimming object circuit is estimated in the trimming estimation phase.

4. The trimming apparatus according to claim 1, wherein:
    the shift register outputs the parallel setting data by shifting the serial data by n bits, n being a positive integer;
    the shift register includes at least n serially connected flip-flops;
    in the trimming data generating circuit,
        the plurality of pull-up resistors include at least n pull-up resistors,
        the plurality of trimming elements include at least n trimming elements, and
        the plurality of switches include at least n NMOS (N-Channel Metal Oxide Semiconductor) transistors,
    the trimming data generating circuit further includes at least n buffers to buffer and output the trimming data; and
    the cutting control circuit includes at least n PMOS (P-Channel Metal Oxide Semiconductor) transistors.

5. The trimming apparatus according to claim 4, wherein:
    gates of the n PMOS transistors are connected to a control signal input pad which receives an input of a control signal to control the application of the electric signal to the trimming data generating circuit;
    sources of the n PMOS transistors are connected to an electric signal input pad which receives an input of the electric signal;
    set terminals of the n flip-flops are connected to a set disable signal input pad which receives an input of a set disable signal;
    a data input terminal of one of the n flip-flops that is located at an initial stage is connected to the data input pad; and
    clock terminals of the n flip-flops are connected to a clock input pad.

6. The trimming apparatus according to claim 4, wherein:
    the pull-up resistors each have a first end and a second end,
    the trimming elements each have a first end and a second end,
    the first ends of the pull-up resistors are connected to a high potential side of the trimming data generating circuit;
    the second ends of the pull-up resistors are connected to drains of the PMOS transistors, input terminals of the buffers, and the first ends of the trimming elements;
    output terminals of the buffers are connected to the trimming object circuit;
    the second ends of the trimming elements are connected to drains of the NMOS transistors;
    gates of the NMOS transistors are connected to output terminals of the shift register; and
    sources of the NMOS transistors are connected to a low potential side of the trimming data generating circuit.

* * * * *